United States Patent
Wehn et al.

(10) Patent No.: US 7,752,524 B2
(45) Date of Patent: *Jul. 6, 2010

(54) METHOD AND DEVICE FOR DECODING DVB-S2 LDPC ENCODED CODEWORDS

(75) Inventors: Norbert Wehn, Queidersbach (DE); Frank Kienle, Kirrweiler (DE); Torben Brack, Kaiserslautern (DE)

(73) Assignee: STMicroelectronics N.V., Amsterdam (NL)

( * ) Notice: Subject to any disclaimer, the term of this patent is extended or adjusted under 35 U.S.C. 154(b) by 993 days.

This patent is subject to a terminal disclaimer.

(21) Appl. No.: 11/366,169

(22) Filed: Mar. 2, 2006

(65) Prior Publication Data

US 2006/0206779 A1    Sep. 14, 2006

(30) Foreign Application Priority Data

Mar. 2, 2005   (EP) .................................. 05290469

(51) Int. Cl.
*H03M 13/00* (2006.01)

(52) U.S. Cl. .............................. 714/758; 714/E11.031; 714/E11.051

(58) Field of Classification Search ................. 714/758, 714/E11.031, E11.051
See application file for complete search history.

(56) References Cited

U.S. PATENT DOCUMENTS 6,633,856 B2 * 10/2003 Richardson et al. ........... 706/15

2005/0149844 A1 * 7/2005 Tran et al. .................... 714/800

OTHER PUBLICATIONS

Xiaofu Wu, Yingjian Xue and Haige Xiang, On Concatenated Zigzag Codes and their Decoding Schemes, Jan. 2004, IEEE, vol. 8, p. 54-56.*

Kienle et al., "Design Methodology for IRA Codes", Proceedings of the ASP-DAC 2004, Asia and South Pacific Yokohama, Japan; Jan. 27-30, 2004, Piscataway, NJ, USA; pp. 459-462, XP010726590; ISBN No. 0-7803-8175-0.

Kienle et al., "Efficient Hardware Realization of IRA Code Decoders", IEEE Workshop on Austin, Texas, USA; Oct. 13-15, 2004; pp. 286-291, XP010743975; ISBN: 0-7803-8504-7.

Kienle et al., "Joint Graph-Decoder Design of IRA Codes on Scalable Architectures", IEEE Int'l Conference on Montreal, Quebec, Canada, May 17-21, 2004; vol. 4, pp. 673-676, XP010718558; ISBN: 0-7803-8484-9.

(Continued)

*Primary Examiner*—Scott T Baderman
*Assistant Examiner*—Enam Ahmed
(74) *Attorney, Agent, or Firm*—Lisa K. Jorgenson; Allen, Dyer, Doppelt, Milbrath & Gilchrist, P.A.

(57) ABSTRACT

The method is for decoding an LDPC encoded codeword, the LDPC code being represented by a bipartite graph between check nodes and variable nodes including first variable nodes and second variable nodes connected to the check nodes by a zigzag connectivity. The method includes updating messages exchanged iteratively between variable nodes and check nodes including a first variable processing phase during which all the messages from the first variable nodes to the check nodes are updated and a check nodes processing phase during which all the messages from the check nodes to the first variable nodes are updated. The check nodes processing phase further includes updating all the messages from the second variable nodes to the check nodes, and directly passing an updated message processed by a check node to the next check node through the zigzag connectivity.

20 Claims, 8 Drawing Sheets

OTHER PUBLICATIONS

Hui Jin et al.; "Irregular Repeat—Accumulate Codes", Internet article: http://www.systems/caltect/edu/EE/Faculty/rjm/paper Sep. 2000, XP002325752.

Etsi en 302307' "Digital Video Broadcasting; Second generation framing structure, channel coding and modulation systems for broadcasting, interactive services, news gathering and other broadband satellite applications", Internet article, Jun. 2004.

"On Iterative Decoding and the Two-Way Algorithm", G. David Forney, Jr. International Symposium on Turbo Codes, Brest, France, 1997, pp. 12-25.

\* cited by examiner

FIG.2 (PRIOR ART)

| Rate | j | $f_j$ | $f_3$ | k | N | K |
|---|---|---|---|---|---|---|
| 1/4 | 12 | 5400 | 10800 | 4 | 49600 | 16200 |
| 1/3 | 12 | 7200 | 14400 | 5 | 43200 | 21600 |
| 2/5 | 12 | 8640 | 17280 | 6 | 38880 | 25920 |
| 1/2 | 8 | 12960 | 19440 | 7 | 32400 | 32400 |
| 3/5 | 12 | 12960 | 25920 | 11 | 25920 | 38880 |
| 2/3 | 13 | 4320 | 38880 | 10 | 21600 | 43200 |
| 3/4 | 12 | 5400 | 43200 | 14 | 16200 | 48600 |
| 4/5 | 11 | 6480 | 45360 | 18 | 12960 | 51840 |
| 5/6 | 13 | 5400 | 48600 | 22 | 10800 | 54000 |
| 8/9 | 4 | 7200 | 50400 | 27 | 7200 | 57600 |
| 9/10 | 4 | 6480 | 51840 | 30 | 6480 | 58320 |

FIG.4 (PRIOR ART)

| Rate | q | E$_{PN}$ | E$_{IN}$ | Addr |
|---|---|---|---|---|
| 1/4 | 135 | 97199 | 97200 | 270 |
| 1/3 | 120 | 86399 | 129600 | 360 |
| 2/5 | 108 | 77759 | 155520 | 432 |
| 1/2 | 90 | 64799 | 162000 | 450 |
| 3/5 | 72 | 51839 | 233280 | 648 |
| 2/3 | 60 | 43199 | 172800 | 480 |
| 3/4 | 45 | 32399 | 194400 | 540 |
| 4/5 | 36 | 25919 | 207360 | 576 |
| 5/6 | 30 | 21599 | 216000 | 600 |
| 8/9 | 20 | 14399 | 180000 | 500 |
| 9/10 | 18 | 12959 | 181440 | 504 |

METHOD AND DEVICE FOR DECODING DVB-S2 LDPC ENCODED CODEWORDS

FIELD OF THE INVENTION

The present invention is generally directed to the field of data communication, and more specifically to the decoding of codewords encoded with a LDPC (Low-Density Parity-Check) code. The invention is more particularly, but not exclusively, directed to data communication systems utilizing Irregular Repeat Accumulate (IRA) codes, and more specifically the Digital Video Broadcast (DVB-S2) standard.

BACKGROUND OF THE INVENTION

LDPC codes were introduced by Gallager in 1962 and rediscovered in 1996 by Mac Kay and Neal. For a long time they had no practical impact due to their computational and implementation complexity. This changed with advances in microelectronics that led to more computational power at hand for simulation and which now enables implementation. Due to their excellent error correction performance they are considered for future telecommunication standards.

An LDPC code is a linear block code defined by its sparse M×N parity check matrix H. It contains j ones per column and k ones per row, called row and column degree respectively. A (j, k)-regular LDPC code has row and column degree of uniform weight, otherwise the code is called irregular. A parity check code can be represented by a bipartite graph also called Tanner graph. The M check nodes correspond to the parity constraints, the N variable nodes represent the data symbols of the codeword. An edge in the graph corresponds to a one in the parity check matrix.

In the LDPC code encoder the packet to encode of size (N−M) is multiplied with a generator matrix G of size (N−M)×N. This multiplication leads to an encoded vector of length N. The generator matrix G and the parity check matrix H satisfy the relation $GH^t=0$ where 0 is the null matrix.

Generally speaking a LDPC code decoder comprises a decoding module which receives the encoded vector of length N and delivers an intermediate vector of length N by using the parity check matrix H. Then a demapping module extracts from said intermediate vector the decoded vector of length (N−M). More precisely LDPC codes can be decoded using message passing algorithms, either in hard or soft decision form. The decoding is then an iterative process, which exchanges messages between variable and check nodes. Typically a Belief Propagation (BP) algorithm is used, which exchanges soft-information iteratively between variable and check nodes. The code performance mainly depends on the randomness of the parity check matrix H, the codeword size N and the code rate R=(N−M)/N.

The channel coding part is a very important component in wireless communication systems like UMTS, WLAN and WPAN. Especially in the domain of WLAN and WPAN the latency of the decoding may be of a critical importance. Low Density Parity Check codes can be seen as a promising candidate for this kind of system in the near future. These codes are being deployed in the DVB-S2 standard and in some optical fiber communication systems. More applications will follow in the near future.

The codes have some very interesting properties, which make them a natural choice for latency critical application. The new DVB-S2 standard features a powerful forward error correction (FEC) system, which enables transmission close to the theoretical limit, and that is enabled by using LDPC codes, which can even outperform Turbo-Codes. To provide flexibility, 11 different code rates (R) ranging from R=¼ up to R=9/10 are specified with a codeword length up to 64800 bits. This huge maximum codeword length is the reason for outstanding communication performance, so the codeword length of 64800 bits is described.

For the DVB-S2 code, 64800 so called variable nodes (VN) and 64800×(1−R) check nodes (CN) exist. The connectivity of these two types of nodes is specified in the standard. The variable nodes comprise information nodes and parity nodes. For decoding the LDPC code, messages are exchanged iteratively between these two types of nodes, while the node processing is of low complexity. Generally, within one iteration, first the variable nodes (VN) are processed, then the check nodes (CN).

For a fully parallel hardware realization, each node is instantiated and the connections between the nodes are hardwired. But even for relatively short block length like 1024 bits, severe routing congestion problems exist. Therefore, a partly parallel architecture may become mandatory for larger block length, where only a subset of nodes are instantiated. With a parallel architecture, during a first phase, all the variable nodes including the information nodes and the parity nodes are processed, subset by subset, then the check nodes, subset by subset.

SUMMARY OF THE INVENTION

An object of the invention is to improve the communication performance and reduce the number of iterations to decode a codeword during the parity nodes updating.

Another object of the invention is to reduce or minimize the size of the memory used.

According to an aspect of the invention, a method is provided for decoding a LDPC encoded codeword including several digital data, (each data may be also called "soft bit" which is a real value coded on several bits and corresponding to the value of the corresponding bit of the transmitted codeword actually received from the channel). The LDPC code is represented by a bipartite graph between check nodes and variable nodes including first variable nodes, for example information nodes, and second variable nodes, for example parity nodes. The second variable nodes are of degree 2 and are connected to the check nodes by a zigzag connectivity. The method comprises updating messages exchanged iteratively between variable nodes and check nodes including a first variable processing phase during which all the messages from the first variable nodes to the check nodes are updated, and a check nodes processing phase during which all the messages from the check nodes to the first variable nodes are updated. In other words, during the first variable nodes processing phase, all the first variable nodes are processed whereas all the check nodes are processed during the check nodes processing phase.

The check nodes processing phase further comprises updating all the messages from the second variable nodes to the check nodes, and directly passing an updated message processed by a check node to the next check node through said zigzag connectivity. In other words, the parity nodes are processed concurrently with the check nodes in the check nodes processing phase. Such a method reduces the number of iterations for decoding LDPC encoded codewords.

In an embodiment, groups of consecutive check nodes are processed by a same processing unit, in particular when the check nodes are mapped vertically on the processing units. The step of directly passing an updated message processed by a check node to the next check node through the zigzag connectivity comprises storing the updated message into an internal memory of the processing unit.

In a preferred embodiment, the stored updated message is obtained by adding a channel value to a message previously updated by a current check node and destined to a parity node connected between the current check node and the next check node. A vertical mapping of the check nodes and the zigzag connectivity permit to a processing unit to process consecutive check nodes, and so the memory requirements are reduced. Indeed, the message which is passed during a forward update of a check node is kept in the processing unit to be used for the processing of the next check node, which is the consecutive check node due to the vertical mapping. Only the messages of the backward update have to be stored. The size of the memory used is then reduced.

More precisely, when the processing unit has calculated a message from a current check node to a second variable node (parity node) connected between the current check node and the next check node of the zigzag configuration, the processing unit can immediately add a channel message to the calculated message. So the resulting message from the parity node to the next check node is stored into an internal memory of the processing unit, to be used for the next processing of the next check node by the same processing unit.

The LDPC code can be an Irregular Repeat-Accumulate (IRA) code, and more precisely a DVB-S2 LDPC code. In a particular application, each encoded codeword is received from a channel, for example a satellite channel, of a wireless communication system.

Another aspect is directed to a decoder for decoding a LDPC encoded codeword including several digital data, the LDPC code being represented by a bipartite graph between check nodes and variable nodes including first variable nodes, for example information nodes, and second variable nodes, for example parity nodes, of degree 2 connected to the check nodes by a zigzag connectivity. The decoder includes a processor for updating messages exchanged iteratively between variable nodes and check nodes. The processor is adapted to update all the messages from the first variable nodes to the check nodes during a first variable processing phase and to update all the messages from the check nodes to the first variable nodes during a check nodes processing phase. The processor is further adapted during the check nodes processing phase, to update all the messages from the second variable nodes to the check nodes, and directly pass an updated message processed by a check node to the next check node through said zigzag connectivity.

According to a preferred embodiment, the decoder architecture is a partly parallel architecture, and the processor comprises P processing units. The check nodes are mapped vertically on the P processing units, one processing unit being adapted to update in the check nodes processing phase all the messages related to P consecutive check nodes. Each processing unit comprises an internal memory for storing the updated message destined to the next check node through the zigzag connectivity.

Advantageously, the decoder comprises a main memory for storing the messages exchanged between the check nodes and the first variable nodes, P channel memories for storing all the digital data of the codeword, and P auxiliary memory banks assigned to the P processing units and directly connected between the outputs and the inputs of the processing units. In the check nodes processing phase, each processing unit is adapted to read the main memory and the corresponding channel memory for performing a forward update for directly updating a message from a current check node to the next check node and to store the updated message in the internal memory, and is adapted to read the main memory, one auxiliary memory bank and the corresponding channel memory for performing a backward update of a message from a second variable node to the preceding check node and to write the updated message in one auxiliary memory bank.

The codeword and the messages may be Log-Likelihood Ratios (LLR). The LDPC code can be an Irregular Repeat-Accumulate (IRA) code, and even a DVB-S2 LDPC code. Another aspect is directed to a terminal of a wireless communication system, including a decoder as described above.

BRIEF DESCRIPTION OF THE DRAWINGS

Other advantages and features of the invention will appear upon examining the detailed description of embodiments, and of the appended drawings in which:

FIG. 2 is a table of parameters describing the DVB-S2 LDPC Tanner graph for different code rates as in the prior art.

FIG. 4 is a table of DVB-S2 code rate dependent parameters as in the prior art.

DETAILED DESCRIPTION OF THE PREFERRED EMBODIMENTS

In the following description, the LDPC code is a DVB-S2 LDPC code as defined in "ETSI EN 302 307 v1.1.1 (2004-06)" defining the DVB-S2 standard, although the invention is not limited to such a code. The parity check matrix H of LDPC code is a sparse binary matrix. The set of valid codewords x has to satisfy $H^t x=0$.

A column in H is associated to a bit of the codeword and a row corresponds to a parity check. A nonzero element in a row of H means that the corresponding bit contributes to this parity check. The code can best be described by a bipartite graph called a Tanner graph, which is a graphical representation of the associations between code bits and parity checks. Code bits are shown as variable nodes $VN_i$ (circles), and parity checks as check nodes $CN_i$ (squares), with edges connecting them. The number of edges on each node is called the node degree. If the node degree is identical, for all variable nodes, the parity check matrix H is called regular, otherwise the parity check matrix is called irregular.

Figure 1:
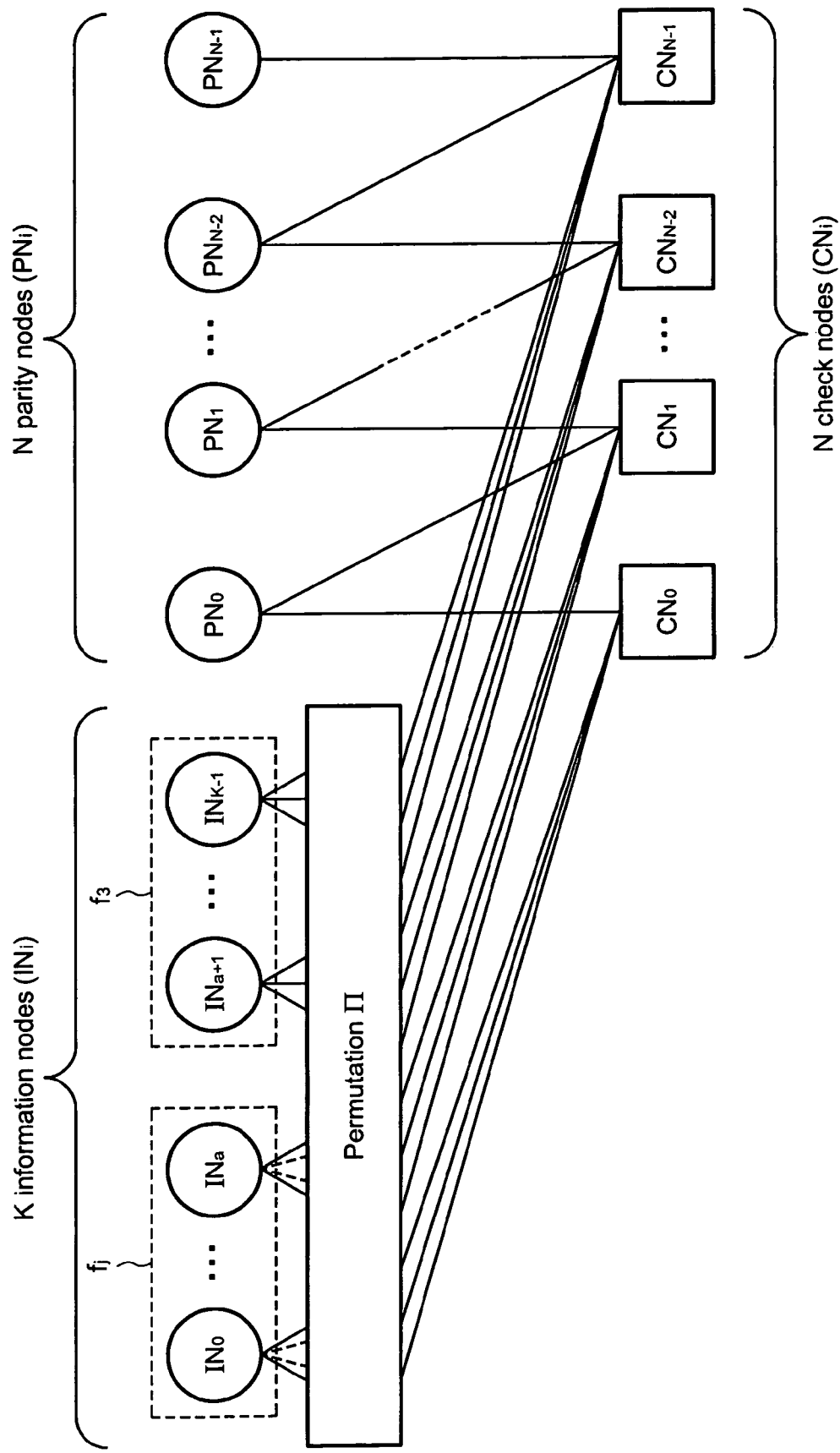
FIG. 1 is a bipartite graph illustrating a DVB-S2 LDPC code as in the prior art.

The DVB-S2 parity check matrix includes two distinctive parts, a random part dedicated to the systematic information, and a fixed part that belongs to the parity information. The Tanner graph of a DVB-S2 code is illustrated in FIG. 1. Two types of variable nodes exist, a first subset of variable nodes, the information nodes $IN_i$, and a second subset of variable nodes, the parity nodes $PN_i$, respectively corresponding to the systematic and parity bits of the codeword.

The permutation $\Pi$ represents the random matrix part of the connectivity between information nodes $IN_i$ and check nodes $CN_i$. The parity nodes $PN_i$ are all of degree two and are connected in a fixed zigzag pattern to the check nodes $CN_i$. The N check nodes have a constant degree k. The K information nodes include two subsets $f_j$ and $f_3$, with $f_j$ and $f_3$ respectively the number of information nodes of degree J and of degree 3. FIG. 2 summarizes the code rate dependent parameters as defined in the DVB-S2 standard, J, $f_j$, $f_3$, N, K, and k wherein k is the degree of the check nodes.

The connectivity of the information nodes and the check nodes is defined by the DVB-S2 encoding rule:

$$\begin{cases} p_j = p_j \oplus i_m \\ j = (x + q(m \bmod 360)) \bmod N \end{cases} \quad (1)$$

wherein:
$p_j$ is the $j^{th}$ parity bit;
$i_m$ is the is the $m^{th}$ information code bit; and
x, q, and n are code rate dependant parameters specified by the DVB-S2 standard.

This encoding rule determines the entries of the parity check matrix. The $m^{th}$ column has nonzero elements in each row j, thus the permutation Π generates one edge between every check node $CN_m$ and information node $IN_j$. The fixed zigzag pattern connectivity between the parity nodes $PN_i$ and the check nodes $CN_i$ is defined by the encoding scheme:

$$p_j = p_j \oplus p_{j-1}, j=1,2,\ldots,N-1 \quad (2)$$

This is a simple accumulator. The corresponding part of the parity check matrix has two nonzero elements in each column, forming a square banded matrix. These type of LDPC codes are also called Irregular Repeat Accumulate codes (IRA codes).

LDPC codes can be decoded using a message passing algorithm. It exchanges soft-information iteratively between the variable nodes and check nodes. The exchanged messages are generally log-likelihood ratios (LLR). Each variable node of degree i calculates an update of message k according to the relation:

$$\lambda_k = \lambda_{ch} + \sum_{l=0, l \neq k}^{i-1} \lambda_l \quad (3)$$

with $\lambda_k$ the LLR updated from the variable node, $\lambda_{ch}$ the corresponding channel LLR of the variable node, and $\lambda_l$ the LLRs of the incident edges of the variable node. The check node message updates are generally calculated according to the relation, for a message k:

$$\tanh(\lambda_k/2) = \prod_{l=0, l \neq k}^{i-1} \tanh(\lambda_l/2) \quad (4)$$

with $\lambda_k$ the LLR updated from the check node, and $\lambda_l$ the LLRs of the incident edges of the check node.

The DVB-S2 standard supports LDPC codes ranging from code rate R equal to ¼ to code rate R equal to 9/10 (FIG. 4). For each DVB-S2 code, the check nodes $CN_i$ and the parity nodes $PN_i$ are connected in a zigzag pattern. In other words, two successive check nodes are connected by a parity node of degree two. A variable node of degree 2 has the property that the input of the first incident edge simply added with the corresponding channel value is the output of the second incident edge, and vice versa.

Generally, in a first phase called the first variable nodes processing phase, all the information nodes are updated, whereas all check nodes are updated in a second phase called the check nodes processing phase. It is also possible to update in the first phase all the messages from the parity nodes to the check nodes and to update in the second phase all the messages from the check nodes to the parity nodes.

Figure 6:
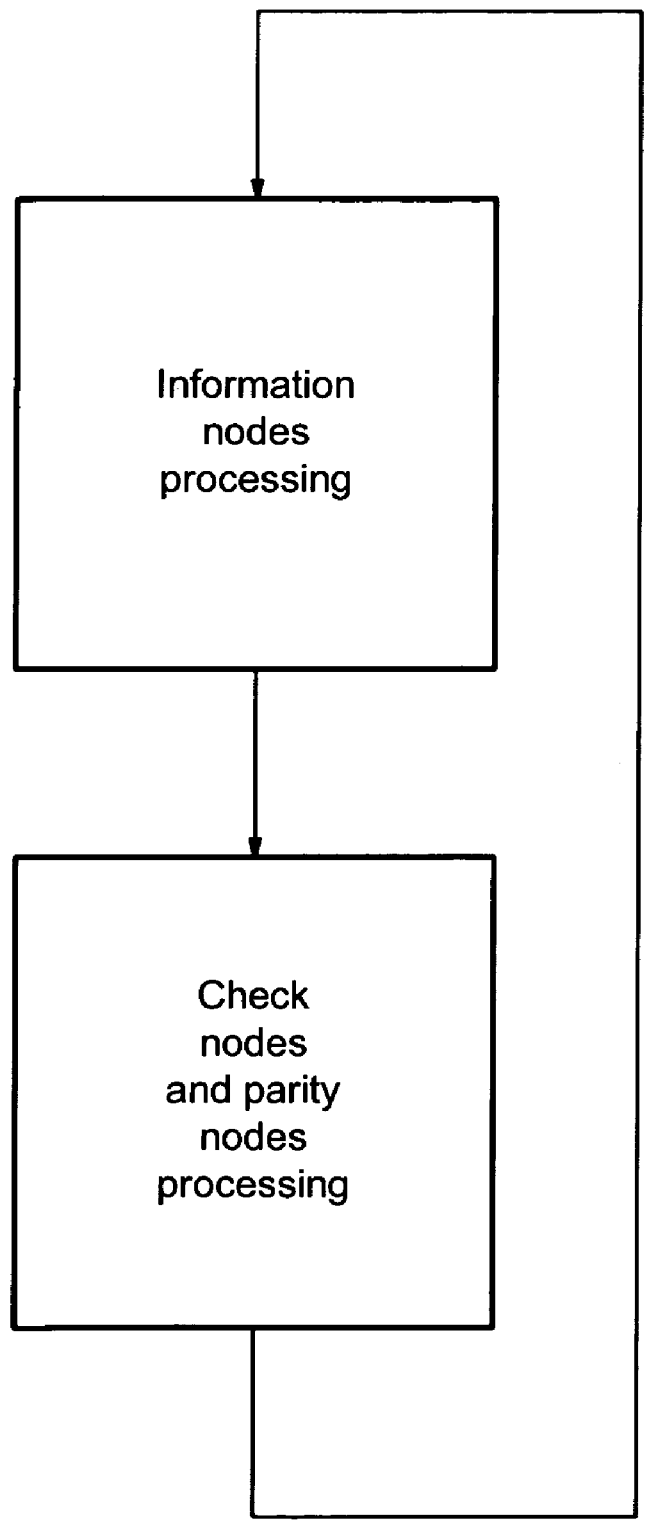
FIGS. 6 and 7 are diagrams illustrating an update scheme related to the parity nodes used by a decoder according to the invention.
Figure 7:
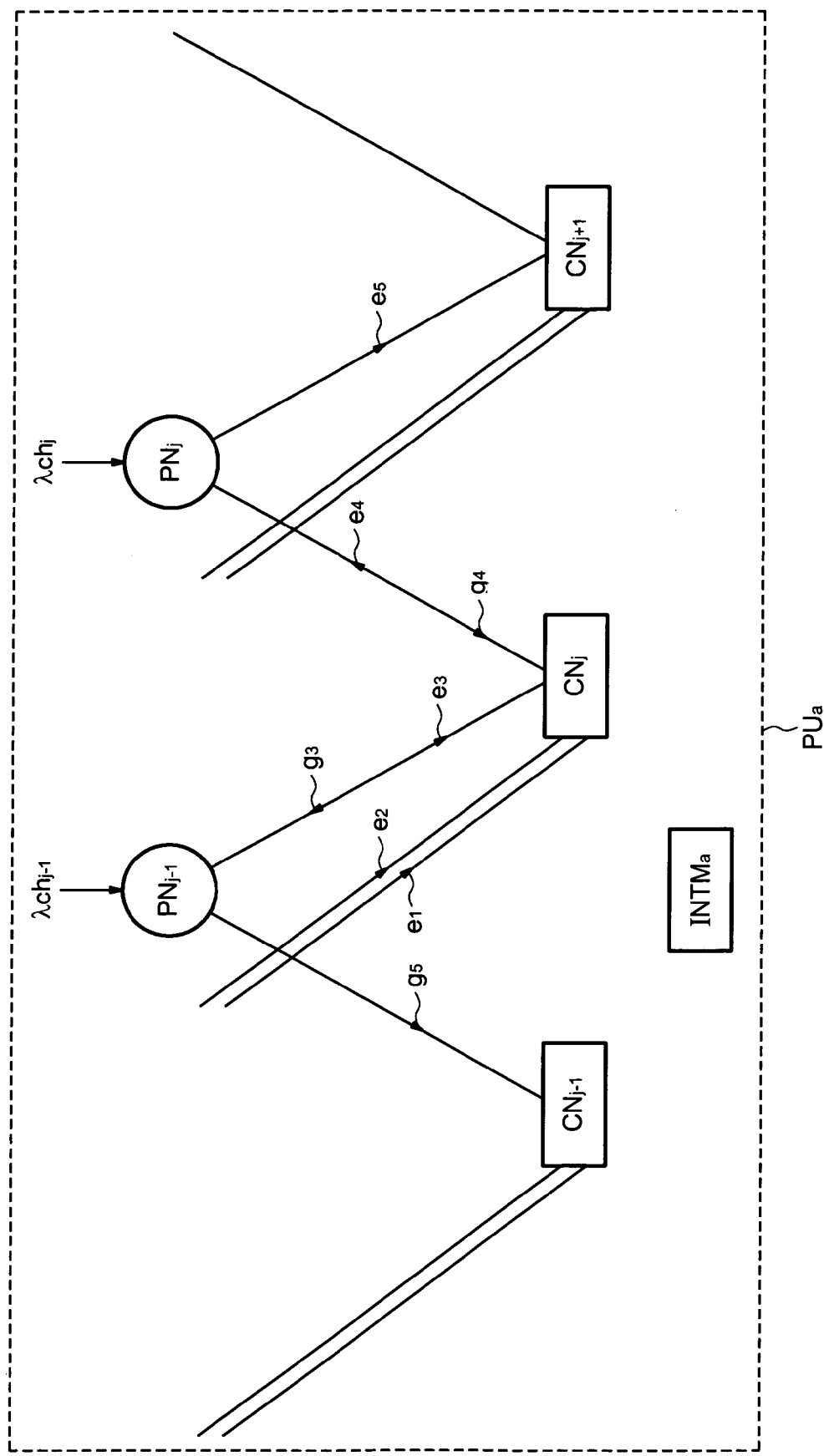

However, according to an aspect of the method, from a sequential processing of the check nodes (e.g. from left to right on FIG. 1), an already updated message can directly pass to the next check node due to the simple zigzag connectivity implying a simple sum of the LLR (the updated message) with the corresponding received LLR channel value of the parity node of the zigzag configuration situated between the two consecutive check nodes. In other words, the check nodes and the parity nodes are processed concurrently as illustrated in FIGS. 6 and 7 and as it will be explained in more details below.

This new update scheme realized by the decoder improves the communication performance, because for decoding a codeword, about 30 iterations are sufficient instead of 40 iterations. Furthermore a size memory gain is obtained because of the avoided storage of messages directly passed to the next check node.

Figure 3:
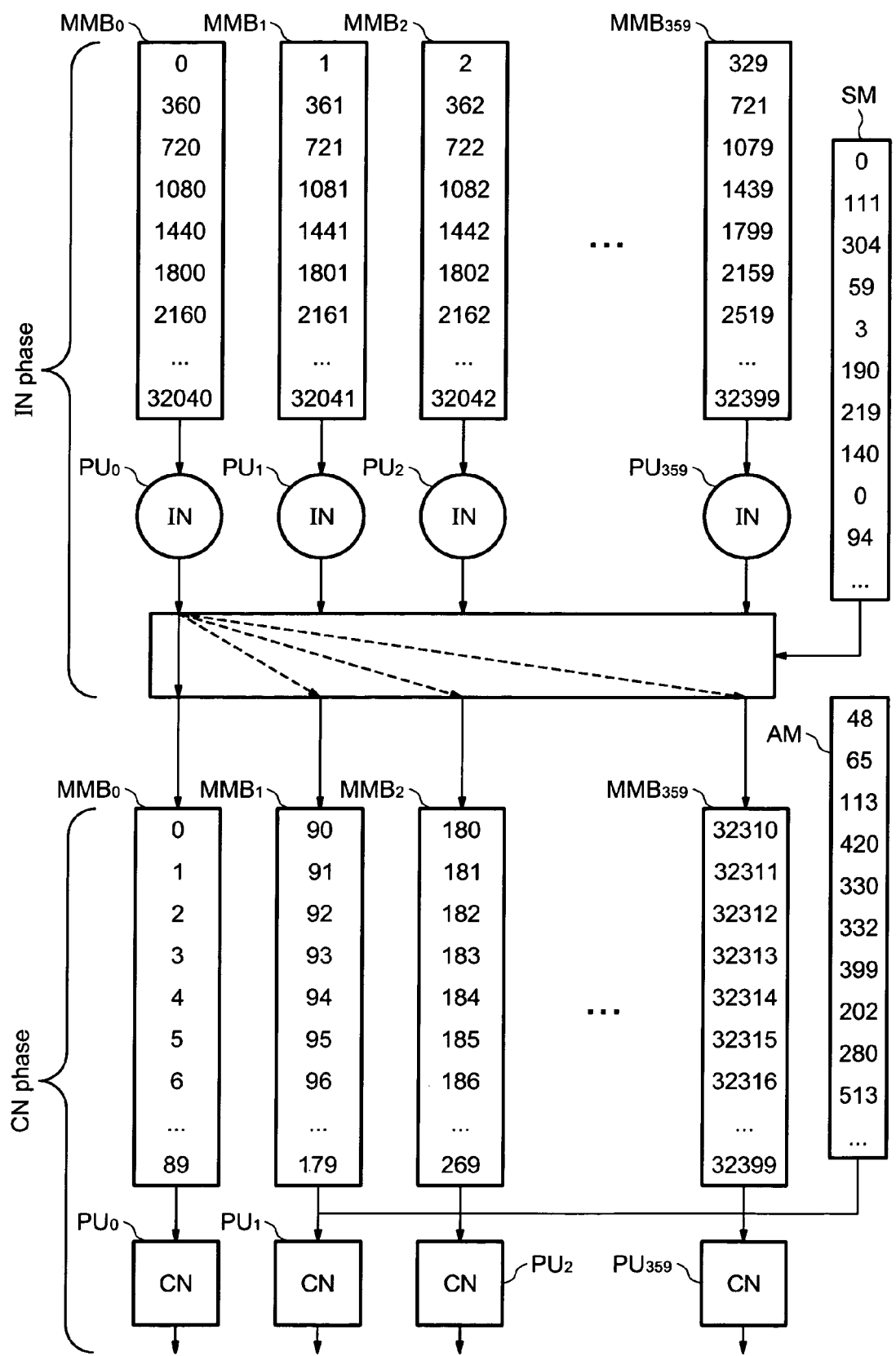
FIG. 3 is a diagram illustrating an example of the mapping of first variable nodes and check nodes on the processing units according to the invention.

FIG. 3 is an example of mapping for a code rate R=½. For a code rate R=½, the DVB-S2 code comprises 32400 parity nodes and 32400 information nodes (see FIG. 2). In FIG. 3 is represented an IN phase wherein the processing units process the information nodes $IN_i$, and a CN phase wherein the processing units process the check nodes $CN_i$. The set of edges E connecting the check nodes $CN_i$ can be split in two subsets $E_{IN}$ and $E_{PN}$, respectively indicating the connections between the check nodes $CN_i$ and the information nodes $IN_i$, and between the check nodes $CN_i$ and the parity nodes $PN_i$.

The mapping of the information nodes $IN_i$ and the check nodes $CN_i$ will now be explained. Due to the varying node degree, the processing units process all incoming messages in a serial manner. A processing unit can produce at most one updated message per clock cycle.

According to the equation 1, the connectivity of 360 edges of distinct information nodes are determined just by one value x, while q is a code rate dependent constant (FIG. 4). These 360 edges can be processed simultaneously by P=360 processing units. Within a half iteration, a processing unit has to process q(k−2) edges. The value (k−2) is the number of edges between one check node and information nodes. To simplify the node mapping, the code rate q has been chosen to satisfy the equation: $E_{IN}/360 = q(k-2)$. That permits that each processing unit has to process the same amount of nodes which simplifies the node mapping.

Always 360 consecutive variable nodes are mapped to 360 processing units. To each processing unit $PU_i$, a main memory bank $MMB_i$ is associated to hold the corresponding messages (edges). The messages generally correspond to LLRs. For an information node of degree b, b storage places are allocated to this information node, because each incident edge has to be stored. Although the memory banks and the processing units have been functionally separated (for the information nodes and the check nodes). On FIG. 3, they are practically realized by the same hardware as it will be explained thereafter with reference to FIG. 5.

The check node mapping depends on the rate dependant factor q. For a code rate=½, q=90, so 90 check nodes are mapped to the first processing unit $PU_0$. The next 90 check nodes are mapped to the second processing unit $PU_1$, and so on. Again, the check node number corresponds to check node degree storage locations. This orthogonal mapping enables to use a simple shuffling network to provide the connectivity of the tanner graph. The shuffling network ensures that at each cycle 360 input messages are shuffled to 360 distinct memory banks. Thus $E_{IN}/360=162000/360=450$ shuffling and addressing information have to be stored at each cycle as shown on FIG. 4 (Addr). The shuffling offsets or shift values and addresses can be extracted from the tables B1 to B11 provided by the DVB-S2 standard.

Generally, the skilled artisan is able to define a shuffling network and its associated shift values from a Tanner graph of a LDPC code. For example, the skilled artisan can refer to the method disclosed in the document "Design Methodology for IRA Codes" by F. Kienle and N. Wehn (Proc. 2004 Asia South Pacific Design Automation Conference, Yokohama, Japan, Jan. 2004).

Figure 5:
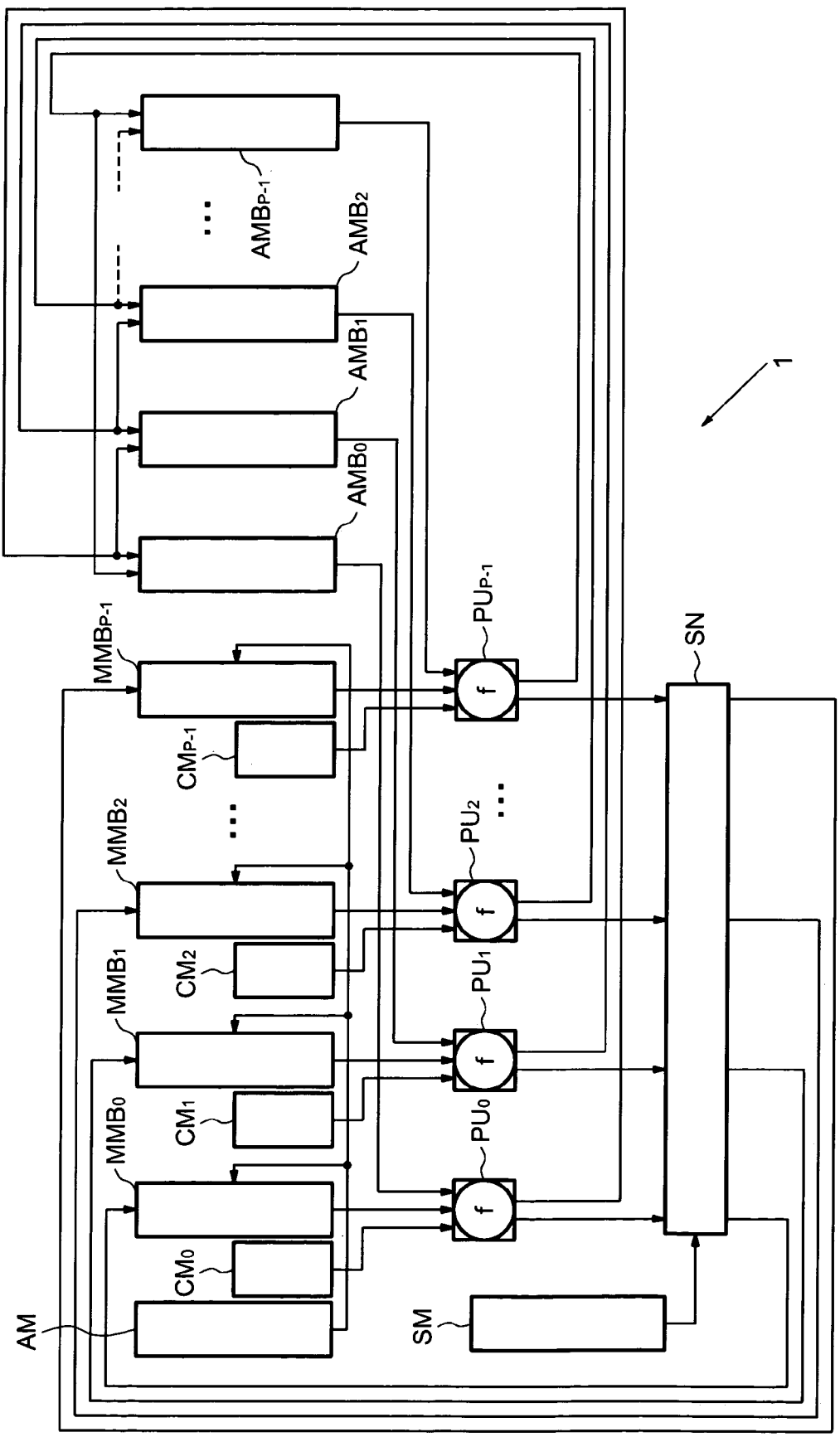
FIG. 5 is a diagram illustrating an embodiment of a LDPC decoder according to the invention.

In FIG. 5, an embodiment of a decoder 1, with a partly parallel architecture, is depicted. The decoder 1 comprises P processing units $PU_0, PU_1, \ldots PU_{P-1}$, for updating messages exchanged iteratively between variable nodes $VN_i$ and check nodes $CN_i$ of a bipartite graph of the LDPC code. The bipartite graph is illustrated in FIGS. 1 and 7. The bipartite graph comprises a subset of first variable nodes, which are the information nodes $IN_j$, and a subset of second variable nodes, which are parity nodes $PN_i$.

The processing units perform iteratively an information nodes processing phase for updating all the messages from the information nodes to the check nodes and a check nodes processing phase for updating all the messages from the check nodes to the information nodes. The decoder 1 further comprises P channel memories $CM_0, CM_1, \ldots, CM_{P-1}$, P main memory banks $MMB_0, MMB_1, \ldots, MMB_{P-1}$, and P auxiliary memory banks $AMB_0, AMB_1, \ldots, AMB_{P-1}$ respectively associated to the P processing units $PU_0, PU_1, \ldots PU_{P-1}$.

The P main memory banks are adapted to store all the updated messages exchanged between the check nodes and the information nodes. To avoid access conflicts, each main memory bank $MMB_i$ can comprise dual port RAMs. The P channel memories are adapted to store all the digital data (soft bits or LLR) of the received codeword. The P auxiliary memories are adapted to store backward updated messages related to the parity nodes, as it will be explained more in detail thereafter.

A shuffling or shifting network SN is connected between the outputs of the processing units $PU_i$ and the main memory banks $MMB_i$. A shift memory SM is associated to the shuffling network SN and the shift values stored in the shift memory SM correspond to the connectivity between the information nodes $IN_i$ and the check nodes $CN_i$ of the bipartite graph of the LDPC code. Thus for a given shift value, all the P inputs of the shuffling network SN are connected the P outputs of the shuffling network SN having ranks shifted with respect to the corresponding ranks of the inputs, by the shift value.

The decoder 1 also comprises an address memory AM for storing a predetermined addressing scheme used for the processing of the check nodes $CN_i$ by the processing units $PU_i$. The processing units $PU_i$ are also respectively directly connected to the auxiliary memory banks $AMB_i$ (i.e. without passing through the shuffling network). The information nodes $IN_i$ and the check nodes $CN_i$ are respectively mapped horizontally and vertically on the processing units $PU_i$.

The decoder processes P nodes, here P=360, in parallel, so 360 messages are provided per cycle of the clock signal clocking this architecture. All the P messages are read from the same address from the main memory banks $MMB_i$. Though, for the information nodes processing phase the reading address is just incremented. A processing unit can accept new data at each clock cycle, while a control flag just labels the last message belonging to a node and starts the output processing. The newly produced P messages are then written back to the same address location, but with a cyclic shift due to the shuffling network SN.

To process the check nodes, it may be necessary to read from dedicated addresses, provided by the address memory AM. These addresses were extracted from node mapping as previously described. More precisely, the addressing scheme stored in the address memory AM has been predetermined for example by simulation taking into account the shift values respectively associated to the edges of the graph. Again, 360 messages are read per clock cycle and written back to the same address after the processing by the shuffling network SN. This ensures that the messages are shuffled back to their original position.

FIG. 3 illustrates an example of mapping, but this example is not the sole possible example. The rows of mapped information nodes can be permuted in comparison with those illustrated on FIG. 3, and processed during a half-iteration in the permuted row order. The result of decoding is identical, and the corresponding couples (shift value of SM, reading address of AM) are identical.

Referring now more particularly to FIGS. 6 and 7, the update scheme related to the parity nodes is explained in more detail. In this example, a part of the zigzag configuration is represented, with three consecutive check nodes $CN_{j-1}$, $CN_j$, $CN_{j+1}$ and two consecutive parity nodes $PN_{j-1}$, $PN_j$. Edges between these three consecutive check nodes $CN_{j-1}$, $CN_j$, $CN_{j+1}$ and information nodes are represented. Furthermore, the LLR of the corresponding channel $\lambda ch_{j-1}$, $\lambda ch_j$ of the two successive parity nodes $PN_{j-1}$, $PN_j$ are represented.

During a clock cycle k, a processing unit $PU_a$ processes the check node $CN_j$, and calculates the message $e_4$ from the check node $CN_j$ to the parity node $PN_{j+1}$, as a function of $e_1$, $e_2$, and $e_3$: $e_4=f(e_1, e_2, e_3)$, with $e_1$ and $e_2$ being the messages from the information nodes to the check node $CN_j$. The messages $e_1$ and $e_2$ are read from at least one main memory bank $MMB_i$.

The message $e_3$ has been calculated in the processing unit $PU_a$ during the precedent check node processing $CN_{j-1}$, and kept in an internal memory $INTM_a$ of the processing unit $PU_a$, due to the zigzag configuration, as it will be explained more in details for the message $e_5$. The message $e_5$ from the parity node PNj to the next check node $CN_{j+1}$ is simply calculated by adding $e_4$ and the channel value $\lambda ch_j$, present in the corresponding channel memory $CM_a$ and corresponding to the parity node $PN_j$: $e_5=e_4+\lambda ch_j$. So, the message $e_5$ is kept in the internal memory $INTM_a$ of the processing unit $PU_a$ for the next processing which is the process of the next check node $CN_{j+1}$. Thus, the processing unit $PU_a$ performs a forward update for directly updating a message from a current check node to the following check node and stores the updated message $e_5$ in the internal memory $INTM_a$.

In a next clock cycle, the message $g_3$ from the check node $CN_j$ to the parity node $PN_{j-1}$ is calculated by the processing unit $PU_a$ ($g_3=f(e_1, e_2, g_4)$, with $g_4$ being the message from the parity node $PN_j$ to the check node $CN_j$, stored in an auxiliary memory bank). The message $g_5$ from the parity node $PN_{j-1}$ to the check node $CN_{j-1}$ is then directly simply calculated by adding message $g_3$ and the LLR value $\lambda ch_{j-1}$ corresponding to the parity node $PN_{j-1}$ and contained in the corresponding channel memory ($g_5=g_4+\lambda ch_{j-1}$). The message $g_5$ is then stored in the corresponding auxiliary memory bank.

The vertical mapping of the check nodes $CN_i$ on the processing units $PU_i$ permits to store less messages in the auxiliary memory banks because only the backward updated messages ($g_4$, $g_5$, . . . ) have to be stored in the auxiliary memory banks $AMB_i$. Each auxiliary memory bank may comprise for example two RAMs, one RAM for the writing operation and one RAM for the reading operation, or dual port RAMs.

Although the method/decoder has been described with a shuffling network SN, associated with shift values, between the main memory banks $MMB_i$ and the processing units, the update scheme of the parity nodes is also compatible with any kind of connection between the information nodes and the check nodes provided, of course, that a zigzag connectivity may be obtained between the parity nodes and the check nodes. More generally, the method/decoder is also compatible with other decoding architectures including a zigzag connectivity, as for example the one described in the document "Design Methodology for IRA Codes" by F. Kienle and N. Wehn (Proc. 2004 Asia South Pacific Design Automation Conference, Yokohama, Japan, Jan. 2004).

Figure 8:
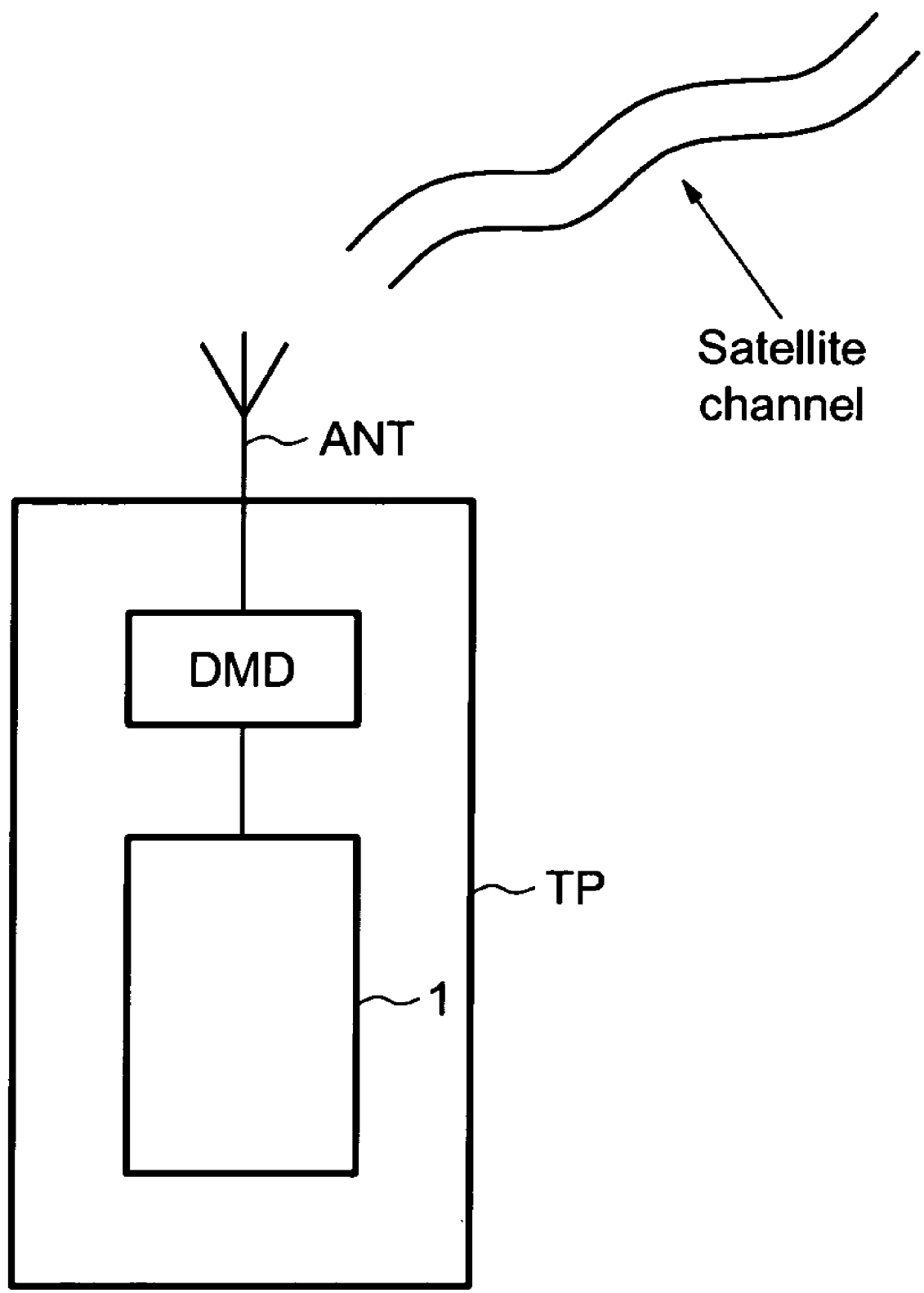
FIG. 8 is a diagram illustrating a terminal of a wireless communication system according to the invention.

The LDPC decoder 1 may be incorporated in a receiver TP (FIG. 8) of a wireless communication system, for example a DVB-S2 receiver receiving encoded codewords through a satellite channel, and comprising other conventional components as, for example, a demodulator DMD.

That which is claimed is:

1. A method for decoding a Low-Density Parity-Check (LDPC) encoded codeword including digital data, the LDPC code being represented by a bipartite graph between check nodes and variable nodes including first variable nodes and second variable nodes of degree two connected to the check nodes by a zigzag connectivity, the method comprising:
updating messages exchanged iteratively between variable nodes and check nodes including
a first variable processing phase during which the messages from the first variable nodes to the check nodes are updated, and
a check nodes processing phase during which the messages from the check nodes to the first variable nodes are updated;
the check nodes processing phase further comprising updating the messages from the second variable nodes to the check nodes, and directly passing an updated message processed by a check node to a next check node through the zigzag connectivity;
wherein the updated message is obtained by adding a channel value to a message previously updated by a current check node and destined to a second variable node connected between the current check node and the next check node.

2. The method according to claim 1, wherein a group of consecutive check nodes are processed by a same processing unit; and wherein directly passing an updated message processed by a check node to the next check node through the zigzag connectivity comprises storing the updated message into an internal memory of the processing unit.

3. The method according to claim 1, wherein the bipartite graph of the LDPC code comprises information nodes defining the first variable nodes and parity nodes defining the second variable nodes.

4. The method according to claim 1, wherein the LDPC code comprises an Irregular Repeat-Accumulate (IRA) code.

5. The method according to claim 1, wherein the LDPC code comprises a Digital Video Broadcast (DVB-S2) LDPC code.

6. The method according to claim 1, wherein each encoded codeword is received from a channel of a wireless communication system.

7. A decoder for decoding an LDPC encoded codeword including digital data, the LDPC code being represented by a bipartite graph between check nodes and variable nodes including first variable nodes and second variable nodes of degree two connected to the check nodes by a zigzag connectivity, the decoder comprising:
a processor for updating messages exchanged iteratively between variable nodes and check nodes;
the processor being configured to update the messages from the first variable nodes to the check nodes during a first variable processing phase, and to update the messages from the check nodes to the first variable nodes during a check nodes processing phase;
the processor being further configured, during the check nodes processing phase, to update the messages from the second variable nodes to the check node, and directly pass an updated message processed by a check node to a next check node through the zigzag connectivity;
wherein the updated message is obtained by adding a channel value to a message previously updated by a current check node and destined to a second variable node connected between the current check node and the next check node.

8. The decoder according to claim 7, wherein an architecture of the decoder is a partly parallel architecture; wherein the processor comprises P processing units; wherein the check nodes are mapped vertically on the P processing units, at least one processing unit being adapted to update, in the check nodes processing phase, the messages related to P consecutive check nodes; and wherein each processing unit comprises an internal memory for storing the updated message destined to the next check node through the zigzag connectivity.

9. The decoder according to claim 8, further comprising:
a main memory for storing the messages exchanged between the check nodes and the first variable nodes;
P channel memories for storing the digital data of the codeword; and
P auxiliary memory banks associated with the P processing units and directly connected between outputs and inputs of the processing units;
wherein during the check nodes processing phase each processing unit is configured to read the main memory and the corresponding channel memory for perfogming a forward update for directly updating a message from a current check node to the next check node and to store the updated message in the internal memory, and is configured to read the main memory, one auxiliary memory bank and the corresponding channel memory for performing a backward update of a message from a second variable node to a preceding check node and to write the updated message in one auxiliary memory bank.

10. The decoder according to claim 7, wherein the digital data of the codeword and the messages comprise Log-Likelihood Ratios (LLR).

11. The decoder according to claim 7, wherein the bipartite graph of the LDPC code comprises information nodes defining the first variable nodes and parity nodes defining the second variable nodes.

12. The decoder according to claim 11, wherein the LDPC code comprises an Irregular Repeat-Accumulate (IRA) code.

13. The decoder according to claim 12, wherein the LDPC code comprises a Digital Video Broadcast (DVB-S2) LDPC code.

14. A wireless receiver of a wireless communication system, the receiver comprising:
a decoder for decoding an LDPC encoded codeword including digital data, the LDPC code being represented by a bipartite graph between check nodes and variable nodes including first variable nodes and second variable nodes of degree two connected to the check nodes by a zigzag connectivity, the decoder including a processor for updating messages exchanged iteratively between variable nodes and check nodes, the processor being configured to update the messages from the first variable nodes to the check nodes during a first variable processing phase, and to update the messages from the check nodes to the first variable nodes during a check nodes processing phase, and the processor being further configured, during the check nodes processing phase, to update the messages from the second variable nodes to the check node, and directly pass an updated message processed by a check node to a next check node through the zigzag connectivity;

wherein the updated message is obtained by adding a channel value to a message previously updated by a current check node and destined to a second variable node connected between the current check node and the next check node.

15. The wireless receiver according to claim 14, wherein an architecture of the decoder is a partly parallel architecture; wherein the processor comprises P processing units; wherein the check nodes are mapped vertically on the P processing units, at least one processing unit being configured to update, in the check nodes processing phase, the messages related to P consecutive check nodes; and wherein each processing unit comprises an internal memory for storing the updated message destined to the next check node through the zigzag connectivity.

16. The wireless receiver according to claim 15, wherein the decoder further comprises:

a main memory for storing the messages exchanged between the check nodes and the first variable nodes;

P channel memories for storing the digital data of the codeword; and

P auxiliary memory banks associated with the P processing units and directly connected between outputs and inputs of the processing units;

wherein during the check nodes processing phase each processing unit is configured to read the main memory and the corresponding channel memory for performing a forward update for directly updating a message from a current check node to the next check node and to store the updated message in the internal memory, and is configured to read the main memory, one auxiliary memory bank and the corresponding channel memory for performing a backward update of a message from a second variable node to a preceding check node and to write the updated message in one auxiliary memory bank.

17. The wireless receiver according to claim 14, wherein the digital data of the codeword and the messages comprise Log-Likelihood Ratios (LLR).

18. The wireless receiver according to claim 14, wherein the bipartite graph of the LDPC code comprises information nodes defining the first variable nodes and parity nodes defining the second variable nodes.

19. The wireless receiver according to claim 18, wherein the LDPC code comprises an Irregular Repeat-Accumulate (IRA) code.

20. The wireless receiver according to claim 19, wherein the LDPC code comprises a Digital Video Broadcast (DVB-S2) LDPC code.

* * * * *

UNITED STATES PATENT AND TRADEMARK OFFICE
CERTIFICATE OF CORRECTION

| | | |
|---|---|---|
| PATENT NO. | : 7,752,524 B2 | Page 1 of 1 |
| APPLICATION NO. | : 11/366169 | |
| DATED | : July 6, 2010 | |
| INVENTOR(S) | : Wehn et al. | |

It is certified that error appears in the above-identified patent and that said Letters Patent is hereby corrected as shown below:

Column 6, Line 67    Delete: "enables to"
                     Insert: --enables one to--

Column 8, Line 66    Delete: "permits to"
                     Insert: --permits them to--

Column 10, Line 42   Delete: "perfogming"
                     Insert: --performing--

Signed and Sealed this
First Day of February, 2011

David J. Kappos
*Director of the United States Patent and Trademark Office*